United States Patent
Oppermann et al.

(10) Patent No.: US 7,928,466 B2
(45) Date of Patent: Apr. 19, 2011

(54) LIGHT EMITTING SEMI-CONDUCTOR DIODE (WITH HIGH LIGHT OUTPUT)

(75) Inventors: Hermann Oppermann, Berlin (DE);
Julius Muschaweck, Gauting (DE);
Jochen Kunze, Moers (DE); Thomas Luce, Esslingen (DE); Eike Krochmann, Neckartenzlingen (DE);
Walter Tews, Greifswald (DE);
Gundula Roth, Leverhagen (DE)

(73) Assignee: Merck Patent GmbH, Darmstadt (DE)

( * ) Notice: Subject to any disclaimer, the term of this patent is extended or adjusted under 35 U.S.C. 154(b) by 207 days.

(21) Appl. No.: 12/009,634

(22) Filed: Jan. 18, 2008

(65) Prior Publication Data
US 2008/0179621 A1     Jul. 31, 2008

Related U.S. Application Data

(63) Continuation-in-part of application No. PCT/DE2006/001267, filed on Jul. 20, 2006.

(30) Foreign Application Priority Data

Jul. 21, 2005 (DE) .................. 10 2005 034 793.2

(51) Int. Cl.
*H01L 33/52* (2010.01)
(52) U.S. Cl. .................. 257/100; 257/98; 257/E33.059; 257/E33.067; 438/26
(58) Field of Classification Search .......... 257/79, 257/98, 100, E33.06, E33.061, E33.068, 257/E33.073, E33.059, 99, E33.067; 438/26, 27, 29

See application file for complete search history.

(56) References Cited

U.S. PATENT DOCUMENTS

| | | | |
|---|---|---|---|
| 6,066,861 A | 5/2000 | Höhn et al. | |
| 6,717,362 B1 | 4/2004 | Lee et al. | |
| 6,809,342 B2 * | 10/2004 | Harada | 257/79 |
| 7,294,861 B2 * | 11/2007 | Schardt et al. | 257/81 |
| 2002/0057057 A1 | 5/2002 | Sorg | |
| 2002/0084749 A1 * | 7/2002 | Ayala et al. | 313/512 |
| 2004/0069993 A1 | 4/2004 | Murano | |
| 2004/0150991 A1 * | 8/2004 | Ouderkirk et al. | 362/231 |
| 2004/0217369 A1 | 11/2004 | Nitta et al. | |
| 2006/0091788 A1 * | 5/2006 | Yan | 313/502 |
| 2006/0208268 A1 * | 9/2006 | Ueno et al. | 257/98 |

FOREIGN PATENT DOCUMENTS

JP      2005-183 727 A      7/2005

* cited by examiner

*Primary Examiner* — Victor Mandala
*Assistant Examiner* — Scott Stowe
(74) *Attorney, Agent, or Firm* — R. S. Lombard

(57) ABSTRACT

A light-emitting semi-conductor diode comprising a light emitting chip at least partially surrounded by a transparent electronics protecting body on which a composite layer foil is disposed, the composite layer foil includes at its side facing away from the electronics protection body a carrier layer, which has a refraction index that is greater than the refraction index of the electronics protection body and, at the opposite side, an active layer of the same material of which the electronics protecting body consists.

18 Claims, 1 Drawing Sheet

LIGHT EMITTING SEMI-CONDUCTOR DIODE (WITH HIGH LIGHT OUTPUT)

CROSS-REFERENCE TO RELATED APPLICATION

This is a continuation-in-part application of pending international application PCT/DE2006/001267 filed Jul. 20, 2006 and claiming the priority of German Application No. 10 2005 034 793.2 filed Jul. 21, 2005.

BACKGROUND OF THE INVENTION

The invention resides in a light-emitting semi-conductor diode with at least one light-emitting chip and a transparent body surrounding the electronic devices at least partially for the protection thereof, and to a method for the manufacture of the semi-conductor diode.

Such a light emitting diode is known from DE 196 38 667 C2. On the electronics-protecting body a light conversion layer is disposed which carries a lens-shaped cover. In order to achieve in the room a homogenous color impression, the light is scattered in the conversion layer. However, no means is provided for conducting heat away from the diode, so that the semi-conductor diode is usable only for relatively small light outputs.

It is the object of the present application to provide a light-emitting semi-conductor diode with high light output and a method for manufacturing such a light emitting semi-conductor diode.

SUMMARY OF THE INVENTION

A light-emitting semi-conductor diode comprising a light emitting chip at least partially surrounded by a transparent electronics protecting body on which a composite layer foil is disposed, the composite layer foil includes at its side facing away from the electronics protection body a carrier layer, which has a refraction index that is greater than the refraction index of the electronics protection body and, at the opposite side, an active layer of the same material of which the electronics protecting body consists.

For the manufacture of this light-emitting semi-conductor diode, a light emitting chip is cast into a transparent plastic which is cured by the application of heat and forms a protective body around the chip. A layer of a constant thickness of maximally 200 micrometers consisting basically of the same material as the protective body is applied to a carrier foil so as to form a compound foil which has a higher index of refraction than the electronics-protective body. The compound foil produced in this way is applied to the protective body and is joined to the protective body by heat application or by exposure to UV radiation.

The invention will be described below in greater detail on the basis of the accompanying drawing.

BRIEF DESCRIPTION OF THE DRAWING

The sole

DESCRIPTION OF PREFERRED EMBODIMENT

Figure 1:
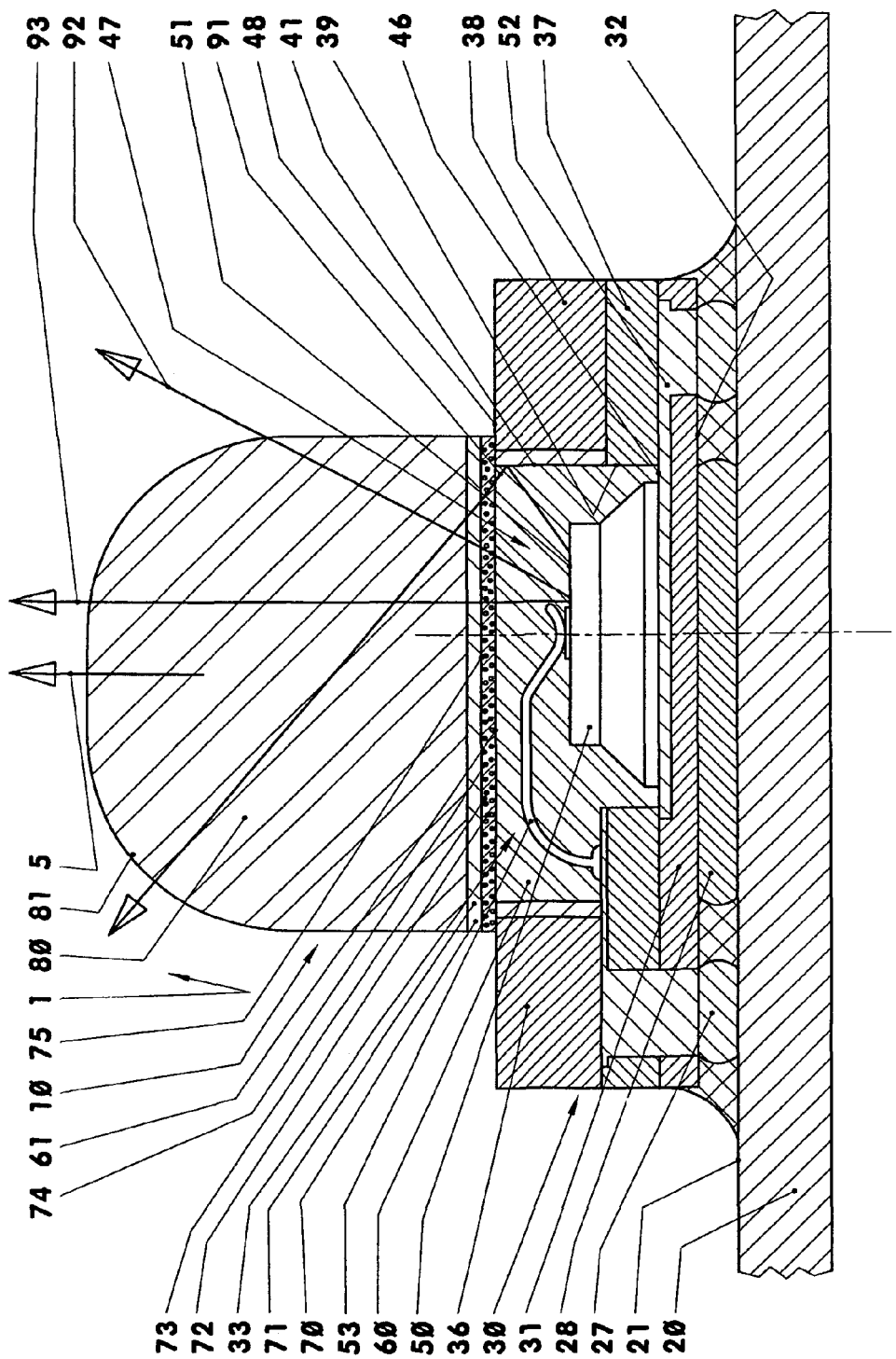
FIG. 1 is a cross-sectional view showing schematically the light-emitting semi-conductor diode according to the invention.

FIG. 1 shows in a cross-sectional view a light-emitting semi-conductor diode 10. On a support plate 20, for example, a metal core plate, a, for example, pot-like housing 30 is disposed on whose bottom 31, for example, a light-emitting chip 50 is mounted. The light-emitting chip 50 is surrounded by a body 60 for the protection of the electronic device (chip) on the electronics protective body 60 a composite layer foil 70 is disposed which separates the electronics-protection body 60 from a light scattering body 80 which disposed optically after the protection body 60.

The light-emitting chip 50 is, for example, a large LED chip having a square base and a high light output. Because of its high light output, the length of its side edges is for example between 750 micrometers and 1250 micrometers. However the edges may be longer or shorter than the given values. The light emitting chip 50 emits for example in the blue or in the ultraviolet range. Instead of a single light-emitting chip 50 the light-emitting diode 10 may comprise several chips 50 emitting light, for example, of different wave length.

The housing 30 comprises a bottom 31 and side walls 36 supported on the bottom 31. In this embodiment the sidewalls comprise a lower section 37 and an upper section 38 which are cemented together and to the bottom 31. However, the housing may be made as a single part. The height of the side walls 36 is between 200 micrometers and 950 micrometers. The base area 32 of the housing 30 with which the housing 30 is disposed on the metal support plate 20 can be round, rectangular or square, etc. This area is longer than, or equals the bottom area of the frustum of a cone with a rectangular-tip whose cover area is formed by the light emitting chip 50.

The inner wall 39 of the side walls 36 are disposed vertically on the bottom 31, for example. However, inner wall 39 of the side walls 36 can extend from the bottom 31 at an angle which is greater or slightly smaller than 90°. The opening 33 of the housing 30 may have almost the same size as that of the light emitting chip 50.

The housing 30 comprises a base material, a non-metallic heat conductive material such as a ceramic material. This may, for example, be AlN, BeO, $A_2O_3$, etc. The housing 30 may include layers or areas which comprise other material.

The inner walls 39 are in the present embodiment metalized by a reflective layer 41. This reflective layer 41 may be such that the light emitted by the chip 50 is reflected at least almost in the direction of the light emission 5. That is in a direction normal to the surface 51 of the light-emitting chip 50. However, also another embodiment is possible for the reflection of the light.

The light-emitting chip 50 is arranged on the inner bottom wall 46 of the housing 30. The chip 50 is connected live to the housing 30 by means of a thermally and electrically conductive connection and by means of a bond wire 53.

The thermally conductive and the electrically conductive connections may be spaced from one another. The thermally conductive connection may be, for example, a solder connection, a cement connection, a thermo-compression connection, etc. These connections can be established with or without additional materials with high heat conductivity. In such an arrangement, the electrical connection may, for example, be established by means of two bond wires. The wires are then connected, for example, to metal coated areas of the housing 30.

Also, an embodiment without band wires, for example, using flip-chip-technology is possible. Herein both contacts of the light-emitting chips are directly connected to the housing 30.

In the light emitting semi-conductor diode 10, as shown in FIG. 1, the light emitting semi-conductor chip 50 has, for example, an edge length of 900 micrometers. The area of the inner bottom 46 is in this case a square with a side length of 1 millimeter. The side walls 36 are in this case 550 micrometers high and extend 300 micrometers above the chip 50.

The electronics-protection body 60 fills the interior 47 of the housing 30 around the light emitting chip 50. This front-face 61 extending normal to the main light emitting direction 5 is for example flush with the front surface 48 of the housing 30. The electronics-protection body 60 is a homogenous body of a transparent plastic. It may be a UV-hardened plastic, a silicon etc. Its refraction index may be between 1.4 and 1.45, but it may have a value of up to 2.5. The material of which this electronics-protection body 60 consists is for example of low viscosity and cross-linked by an additive. During hardening in this way a planar front surface 61 of the electronics-protection body 60 is obtained and the electronics-protection body 60 is subjected only to little shrinkage.

The composite layer foil 70 consists in this embodiment of a carrier layer 71 and a converter layer 72. Herein the converter layer 72 is connected to the electronics protection layer 60 and is disposed, for example, on the front face 48 of the housing 30. The composite layer foil 70 has here a constant thickness.

The carrier layer 71 is an optically transparent plastic material foil, for example, of a thermo-plastic material such as polycarbonate, polysulfide, polymethyl methacrylimide referred to as PMMI or another thermoplastic. It has a refraction index which is higher than the refraction index of the electronics-protection body 60. For example, if the electronics-protection body 60 has a refraction index of 1.45, the carrier layer 71 has a refraction index of, for example, between 1.5 and 1.7. The refraction index of the carrier layer 71 however may also be higher. For an electronics-protection body 60 with a refraction index of 2.5, the carrier layer 71 may have a refraction index of, for example, 3.0. The thickness of the carrier layer 71 is between 50 micrometers and one millimeter. In the embodiment shown herein, the carrier layer 71 has a thickness of 150 micrometers.

The converter layer 72 consists of a base material 73 with a converter 74 embedded therein. As base material 73, the same material of which the electronics-protection device 60 consists. The converter material 74 is, for example, a powder such as phosphorus powder. The thickness of the converter layer 72 is between 35 and 200 micrometers.

The converter material 74 is a phosphorus or a mixture of phosphorus which absorbs light in the ultraviolet and/or visible spectral range and emits light, which has a greater wave length than the primary radiation of the light emitting chip 50. Herein the converter material 74 comprises, for example, one or several phosphorus from the group of oxygen-containing phosphorus including acidic compounds and/or phosphorus which includes preferably Si, Al, P or Ge as central ion.

The layer 72 applied to the carrier layer 71 may additionally include further materials, for example, particles for the scattering of the transmitted radiation. This layer however does not need to include converter particles 74. Also, the composite layer foil 70 may include further layers arranged between the converter layer 72 and the carrier layer 71. These layers then have, for example, each a refraction index which is higher than the refraction index of the electronics-protecting body 60.

The light scattering body 80 is in this embodiment a transparent body which comprises, for example, an optical lens 81. It is disposed on the carrier layer 71 and is for example, fused together therewith. The light scattering body 80 consists of the same material as the carrier layer 71.

The light emitting semi-conductor diode 10 may also be made without a light scattering body 80. Also, an embodiment without housing 30 and/or support plate 20 is conceivable.

For the manufacture of the light emitting semi-conductor diode 10 first, for example, the light emitting semiconductor chip 50 is inserted into the housing 30. Herewith, the light emitting chip 50 is connected to the housing by cementing, bonding, soldering, thermo-compression welding etc. The solder materials used for soldering may, for example, be SnAg, AnSn, AnGe, etc. For bonding relatively easily deformable materials such as Au, Ag, Cu, Al, In, etc., may be used. For cementing, for example, electrically and thermally conductive adhesives, such as an epoxy filled with silver particles.

The housing 30 together with the light emitting chip 50 is then soldered or cemented onto the metal core support plate 20. In the embodiment presented herein, the housing 30 and the support plate 20 are interconnected by flat solder deposits 27 providing for a large heat transfer area. In connection with soldering solder balls of soft solder which are self-centering, or solder balls with a non-melting care etc. may be used. In this way, a good thermally conductive connection is formed between the two components 20, 30. In the light emitting semi-conductor diode 10 as shown in FIG. 1 a heat conductive polymer 28, a so-called under filler is disposed between the housing 30 and the support plate 20. This may be a filled epoxy resin by which the gap between the housing 30 and the support plate 20 is filled. In addition, the position of the housing 30 on the support plate 20 can be curved by a form fitting jointure.

On the bottom surface 32 of the housing 30 and on the top side 21 of the support plate 20 markups may be provided for determining in connection with a quality examination the accuracy of the position of the housing 30 on the support plate 20. This is accomplished, for example, by X-ray measurements. These markings consist, for example, of the same materials which are used for the electrical and thermal connection between the housing 30 and the support plate 20. The markings may be squares, rectangles, semicircles, circles, crosses, etc. which can easily be recognized in an X-ray system.

The electric connection of the light emitting semi-conductor chip 50 with electric conductor webs on the support plate 20 can be established by way of electrically conductive areas of the housing 30 or by way of electrical connectors which extend through the housing 30.

The housing 30 is now filled with the material of the electronics-protection body 60. This is done by pouring, dripping, injecting, imprinting, etc. Herein the housing 30 is filled, for example, in a single stage in such a way that the material of the electronics-protection body 60 is flush with the front face 48 of the housing 30.

After filling the electronics-protection body 60 is cured, for example at a temperature of 120° C. For the curing also UV light may be used.

For the manufacture of the light emitting semi-conductor diode 10 without housing, the electronic-protection body 60 may also be cast in a mold into which the light emitting chip 50 is placed. This light emitting semi-conductor diode 10 may be mounted onto the support plate, for example, by soldering.

The composite layered foil 70 is produced, for example, by depositing the converter layer 72 on the carrier layer 71. For the manufacture of the converter layer 72 first the converter powder 74 is homogenously mixed with the base material 73, such that no bubbles are formed. This matrix is then applied to the carrier layer with uniform thickness. During the manufacture of the layer 72 also other compounds can be admixed to the base material 73. The layer 72 may also be prepared without converter powder 74 or other admixed compounds.

The converter layer 72 can be deposited on the carrier layer 71, for example, by spinning, rolling, casting, painting, etc. With these methods a good adherence of the layers 71, 72 on each other and uniform layer thicknesses can be obtained. Peeling of the layers 71, 72 off each other is prevented thereby. The two layers are joined without any gap therebetween.

Expediently, the carrier layer 71 can be pretreated before the application of the converter layer 72 by plasma treatment, by chemical treatment, by sanding, etc. in order to improve the adherence between the two layers 71, 72.

The composite layer foil 70 is then applied to the electronics-protection body 60 so that the converter layer 72 abuts the electronics protecting body 60. For example, by the application of heat the two similar materials melt together. Additionally, the composite layer foil 70 may be in contact with the front face 48 of the housing 30 and be connected thereto expediently by the addition of an additive compound.

The composite layer foil 70 may also extend over several electronics-protection bodies 60 and housings 30 which have been manufactured together. If individual light emitting semiconductors diodes 10 are needed, the composite layer foil 70 is then cut.

The light emitting semi-conductor diode 10 prepared in this way is then placed, for example, into an injection molding tool and the light scattering body 80 is injection molded onto it. The light scattering body is joined with the carrier layer 71 of the compound layer foil 70 under the influence of the temperature and the pressure of the injection molding procedure. Expediently, the carrier layer 71 may be prepared herefor by a plasma treatment.

However, the light emitting semi-conductor diode 10 may also be manufactured in a different order.

During operation of the light emitting semi-conductor diode 10, the light emitting semi-conductor chip 50 emits, for example, blue light 91-93 shown as exemplary light rays in FIG. 1. The heat generated during operation is conducted via the housing 30 to the support plate 20. Because of the large heat transfer areas between the light emitting chip 50 and the housing 30 and between the housing 30 and the support plate 20, the chip 50 can be operated with high power output.

The light 91-93 is emitted by the chip 30 in a semi-sphere around the main light propagation direction 5 into the electronics-protection body 60. Light 91 which is directed onto the inner wall 39 of the housing 30 is reflected by the reflective layers 41 toward the housing opening 33.

During transition from the electronics-protection body 60 to the composite layer foil 70, the light 91-93 is not diffracted or reflected since the electronics-protection body 60 and the converter layer 72 consists of the same material 73 and there is no gap between the two parts 71, 72. In the converter layer 72, the light 91, 93 meets the phosphorus particles 74 whereby the wave length of the emitted light 91, 93 is partially or totally converted. For the eye, the light becomes visible white light. Because of the uniform layer thickness of the converter layer 72 an essentially constant color temperature is maintained over the whole light emission area of the light emitting semi-conductor diode 10. With a concurrent manufacture of several light emitting diodes 10 using a common composite layer foil 70, the light emitting diodes have essentially the same color temperature.

Within the compound layer foil 70, the converted light 91-93 reaches the interface 75 between the converter layer 72 and the carrier layer 71. At this interface 75, the light 91-93 passes from the material of the electronics-protection body 60 to the material of the carrier layer 71 without passing through an air gap. A total reflection which could result in a self absorption of the emitted light 91-93 in the electronics-protection body 60 will therefore not take place.

Upon passing through the interface 75, the light 91-93 leaves the area of a material with a low refraction index and enters the area of a material with a refraction index which is higher than that of the first material. The light is refracted hereby in a direction toward a line extending normally to the interface 75 at the point of penetration. Light 92 which reaches in the electronics-protection body 60 with a refraction index of 1.41, the interface 75 at an angle of 30° with respect to a normal, is deflected upon transition into a carrier layer 71 with a refraction index of 1.5 to an angle of 28° with respect to the normal. In this way, the light 91-93 becomes more focused. Because of the small opening angle of the light beam, the light emitting area is relatively small and light strength is to a large extent uniform.

Then the focused light reaches, without further refraction, the light distribution body 80 which is connected to the carrier layer 71 without any gap.

The light passes through the light distribution body 80 and the optical lens 81 to the ambient 1. Because the light is bundled the optical lens 81 can be relatively small. Also additional optical elements such as additional optical lenses can have correspondingly small dimensions.

The narrow light guidance in the electronics-protection body 60 together with the successively increasing refraction indexes of the materials ensures that the light emitting semi-conductor diode 10 has a narrow opening angle with high light density.

The successive increase of the refraction indices makes it furthermore possible to achieve an opening angle of substantially less then +/−90 degrees without the need for an undercut of the light distribution body 80 and the optical lens 81. This facilitates the manufacture of the light emitting semi-conductor diode 10 by injection molding.

What is claimed is:

1. A light emitting semi-conductor diode (10) comprising at least one light emitting chip (50) having a light emitting surface (51), a transparent electronics-protecting body (60) at least partially surrounding the light emitting chip (50), a composite layer foil (70) disposed optically next to and on the electronics-protecting body (60) so as to at least partially cover it, said composite layer foil (70) comprising a carrier layer (71) at its side facing away from the electronics-protection body (60) which has a refraction index for visible light which is greater than the refraction index for visible light of the electronics-protection body (60) and said composite layer foil (70) comprising at its side facing the electronics-protecting body (60), an active layer (72) whose base material (73) consists of the same material as the electronics-protecting body (60), the active layer (72) and the carrier layer (71) having an interface (75) therebetween, the active layer (72) is arranged optically next to carrier layer (71) at interface (75) without an air gap.

2. The light emitting semi-conductor diode according to claim 1, wherein the material of which the electronics-protecting body (60) consists, has a refraction index for visible light which is equal to or less than 2.5.

3. The light emitting semi-conductor diode according to claim 1, wherein the active layer (72) disposed optically adjacent to and on the electronics-protecting body (60) includes a converter material (74).

4. The light emitting semi-conductor diode according to claim 3, wherein the converter material (74) comprises one of phosphorus and a mixture of phosphorus which absorbs primary radiation in the ultraviolet and/or in the visible spectral range as generated by the light emitting chip (50) and emits light of a wave length greater than that of the primary radiation generated by the light emitting chip (50).

5. The light emitting semi-conductor diode according to claim 1, wherein a light scattering body (80) is arranged optically next to the carrier layer (71).

6. The light emitting semi-conductor diode according to claim 5, wherein the light scattering body (80) consists of the same material as the carrier layer (71).

7. The light emitting semi-conductor diode according to claim 1, wherein the light emitting chip (50) is connected to a metal core plate (20) in an electrically and thermally conductive manner.

8. The light emitting semi-conductor diode according to claim 1, wherein the light emitting chip (50) is at least partially surrounded by a housing (30) including a bottom (31), the housing (30) includes sidewalls (36) having inner wall (39) extending from the bottom (31) about vertically.

9. The light emitting semi-conductor diode according to claim 8, wherein the housing (30) comprises a non-metallic heat conductive material, the inner wall (39) of sidewalls (36) of housing (30) including a metalized reflective layer (41) for reflecting visible light emitted by chip (50) to at least almost in a direction normal to the light emitting surface (51) of the chip (50).

10. The light emitting semi-conductor diode according to claim 8, wherein the light emitting chip (50) is connected to the housing (30) without bond wires.

11. The light emitting semi-conductor diode according to claim 8, wherein the composite layer foil (70) is disposed on the front surface (48) of the housing (30) which extends across the main light emission direction.

12. A method of manufacturing a light emitting semi-conductor diode (10), the light emitting semi-conductor diode (10) comprising at least one light emitting chip (50) having a light emitting surface (51), a transparent electronics-protecting body (60) at least partially surrounding the light emitting chip (50), a composite layer foil (70) disposed optically next to and on the electronics-protecting body (60) so as to at least partially cover it, said composite layer foil (70) comprising a carrier layer (71) at its side facing away from the electronics-protection body (60) which has a refraction index for visible light which is greater than the refraction index for visible light of the electronics-protection body (60) and said composite layer foil (70) comprising at its side facing the electronics-protecting body (60), an active layer (72) whose base material (73) consists of the same material as the electronics-protecting body (60), the active layer (72) and the carrier layer (71) having an interface (75) therebetween, the active layer (72) is arranged optically next to the carrier layer (71) at the interface (75) without an air gap, said method comprising the steps of:

casting the light emitting chip (50) into a transparent plastic material which is cured under the influence of heat, so as to form the electronics-protecting body (60), applying the active layer (72) of a uniform thickness of not more than 200 micrometers to the carrier layer (71) which has a higher refraction index for visible light than the electronics-protection body (60) so as to form the composite foil (70), depositing the composite foil (70) obtained in this way on to the electronics-protection body (60) and inter connecting the active layer (72) with the electronics-protection body (60) by the application of heat or UV radiation.

13. The method according to claim 12, wherein the material, of which the electronics-protecting body (60) consists, has a refraction index for visible light equal to or less than 2.5.

14. The method according to claim 12, wherein the active layer (72) is rolled onto the carrier layer (71).

15. The method according to claim 12, wherein a converter material (74) is mixed into a base material (73) to form the active layer (72) matrix without containing any bubbles and this matrix is subsequently deposited on the carrier layer (71) with a uniform thickness.

16. The method according to claim 12, wherein the light-emitting chip (50) is disposed on an inner bottom wall (46) of a pot-like housing (30) and is connected thereto at least in a thermally conductive manner.

17. The method according to claim 16, wherein the housing (30) is mounted onto a metal core support plate (20) and at least is thermally conductive connected thereto.

18. The method according to claim 17, wherein the housing (30) is connected to the metal core support plate (20) by means of flat solder deposits (27) providing for a large heat transfer area.

\* \* \* \* \*